(12) United States Patent
Kim

(10) Patent No.: US 6,249,455 B1
(45) Date of Patent: Jun. 19, 2001

(54) MULTI-STEP PULSE GENERATING CIRCUIT FOR FLASH MEMORY

(75) Inventor: Joo Young Kim, Seoul (KR)

(73) Assignee: Hyundai Electronics Industries Co., Ltd., Kyungki-do (KR)

( * ) Notice: Subject to any disclaimer, the term of this patent is extended or adjusted under 35 U.S.C. 154(b) by 0 days.

(21) Appl. No.: 09/468,634

(22) Filed: Dec. 22, 1999

(30) Foreign Application Priority Data

Dec. 28, 1998 (KR) .................................... 98-59339

(51) Int. Cl.[7] .................................................. G11C 16/04
(52) U.S. Cl. .............................. 365/185.19; 365/185.2; 365/185.33
(58) Field of Search ....................... 365/185.19, 185.2, 365/185.18, 185.22, 185.24, 185.33

(56) References Cited

U.S. PATENT DOCUMENTS

| | | | |
|---|---|---|---|
| 5,257,225 | 10/1993 | Lee | 365/185 |
| 5,448,712 | 9/1995 | Kynett et al. | 395/430 |
| 5,680,350 | 10/1997 | Lee | 365/185.24 |
| 5,956,272 | 9/1999 | Roohparvar | 365/185.19 |
| 6,097,632 | * 8/2000 | Roohparvar | 365/185.19 |

FOREIGN PATENT DOCUMENTS

| | | |
|---|---|---|
| 7-073685 | 3/1995 | (JP) . |
| 7-312093 | 11/1995 | (JP) . |
| 8-036893 | 2/1996 | (JP) . |
| 9-055092 | 2/1997 | (JP) . |
| 10-228786 | 8/1998 | (JP) . |

\* cited by examiner

*Primary Examiner*—David Nelms
*Assistant Examiner*—David Lam
(74) *Attorney, Agent, or Firm*—Pennie & Edmonds LLP

(57) ABSTRACT

The present invention describes a multi-step pulse generating circuit for a flash memory comprising a reference voltage generating circuit to generate uniform voltage: a first comparator to compare the output voltage of the first comparator with the feedback value; a voltage drop means to get desirable voltage by dropping the output voltage of the first comparator; a positive charge pump circuit to generate desirable high voltage; a diode chain to drop the output voltage of the positive charge pump circuit; a second comparator to compare the output voltage of the voltage drop means with the output voltage of the diode chain; and a switching means to control the output voltage of the positive charge pump circuit depending on the output of the second comparator.

5 Claims, 5 Drawing Sheets

MULTI-STEP PULSE GENERATING CIRCUIT FOR FLASH MEMORY

SUMMARY OF THE INVENTION

1. Field of the Invention

The present invention relates to a multi-step pulse generating circuit for a flash memory, and more particularly to a multi-step pulse generating circuit for a flash memory to reduce chip area and to prevent coupling by generating multi-step pulse with simple devices, not using complicated devices.

2. Description of the Prior Art

Multi-step pulse is used to improve threshold voltage level of a flash memory cell when the cell is erased or programmed. In this case, there is a problem in that the threshold voltage level of the cell may be improved, but device area thereof increases.

FIG. 1 is a circuit diagram to describe a conventional multi-step pulse generating circuit for a flash memory.

According to an enable signal EN, a first comparator COM11 receives the reference voltage VREF and the output fb of the first comparator COM11, and outputs after comparing them. Then, to operate the first comparator COM11, VREF and fb, that is the input voltage of the first comparator COM11, should have the same fixed potential. The output of the first comparator COM11 is entered to a second comparator COM12 after being dropped as much as uniform potential via the first through third resistors R1 to R3.

On the other hand, the input voltage VPPI generated from a positive charge pump circuit 10 is dropped to uniform potential according to the resistance of a diode chain 13 driven by a switch circuit 12 operating depending on a high voltage latch means 11, and then entered to the second comparator COM12. The second comparator COM12 compares the voltage (VREFINT: first input voltage) determined by the reference voltage VREF with the voltage (VREGLEVEL: second input voltage) determined by the input voltage VPPI. If the second input voltage VREGLEVEL is higher than the first input voltage VREFINT, the second comparator COM12 outputs high potential and lowers output voltage OUT by turning on a first NMOS transistor M11. While the second input voltage VREGLEVEL is lower than the first input voltage VREFINT, it outputs low potential and allows the input voltage VPPI to rise again by turning off the first NMOS transistor M11. Such a potential of the second input voltage VREFLEVEL of the second comparator COM12 is determined by a diode chain 13. Each PMOS transistor D11 to D1n of the diode chain 13 is controlled by each switch S11 to S1n in a switching means 12. Also, the switching means 12 is controlled by a high voltage latch means 11. The first through Nth high voltage latch circuits L1 through LN of the high voltage latch means 11 are operated as a level shifter, respectively to latch the input voltage VPPI generated from the positive charge pump circuit 10 and then to output low voltage by each control signal C1 to Cn. If the low voltage is outputted from a third high voltage latch circuit L3 by the control signal C3, the switch S13 is turned on, and thus the PMOS transistor D13 does not operate. As the result, the input voltage VPPI passes through the switch S13 without going through the PMOS transistor D13, and then is entered to a first node K11. Therefore, the output voltage VPPI of the positive charge pump circuit 10 is entered to a second node K12 after being dropped as much as the threshold voltage of the remain transistors D14 to D1n. Since the second NMOS transistor N10 is turned on but the third NMOS transistor N11 is turned off by the enable signal EN, the voltage applied to the second node K12 is entered to the second comparator COM12.

While such a multi-step pulse generating circuit uses each different number of PMOS transistors D11 to D1n to comprise a diode chain 13 determining the potential of a second input signal VREGLEVEL of the second comparator, the circuit may have desirable VPPI potential because the second input potential VREGLEVEL of the second comparator to have the potential dropped as much as the diode threshold voltage corresponding to the number of diodes changes. For the result, diodes are needed as many as the steps required by the first through Nth high voltage latch circuits L1 to LN, the gate control circuit of PMOS transistors S11 to S1n that are the switches to turn on/off each PMOS transistors D11 to D1n of a diode chain 13. On the process to drive each switch S11 to S1n, if the size of each transistor to comprise switches is not appropriate, coupling of parasitic capacitors occurs and circuit does not operated in normal since the junction of each transistor S11 to S1n and the n-well is jointly connected, and junction of the transistors S11 to S1n and that of each PMOS transistor D11 to D1n is also jointly connected. Also there is a problem in that inevitable delay occurs due to the serial feedback structure that output voltage VPPI of a positive charge pump circuit 10 is discharged after passing through a diode chain and then being compared in a second comparator COM12.

SUMMARY OF THE INVENTION

Accordingly, it is an object of the present invention to provide a multi-step pulse generating circuit for a flash memory to simplify circuit configuration and to reduce device area by fixing high voltage generated from a positive charge pump circuit and changing the potential of the compared reference voltage.

To achieve the above objects, a multi-step pulse generating circuit for a flash memory in accordance with the present invention comprising:

a reference voltage generating circuit to generate uniform voltage;

a first comparator to compare the output voltage of the reference voltage generating circuit with the feedback value;

a voltage drop means to get desirable voltage by dropping the output voltage of the first comparator; a positive charge pump circuit to generate desirable high voltage; a diode chain to drop the output voltage of the positive charge pump circuit; a second comparator to compare the output voltage of the voltage drop means and the output of the diode chain; and a switching means to control the output voltage of the positive charge pump circuit depending on the output of the second comparator.

It is to be understood that both the foregoing general description and the following detailed description are exemplary and explanatory and are intended to provide further explanation of the invention as claimed.

BRIEF DESCRIPTION OF THE DRAWINGS

The above object, and other features and advantages of the present invention will become more apparent by describing the preferred embodiment thereof with reference to the accompanying drawings, in which.

Similar reference characters refer to similar parts in the several views of the drawings.

DETAILED DESCRIPTION OF THE PREFERRED EMBODIMENTS

Reference will now be made in detail to the preferred embodiments of the present invention, and examples of which are illustrated in the accompanying drawings.

Figure 1:
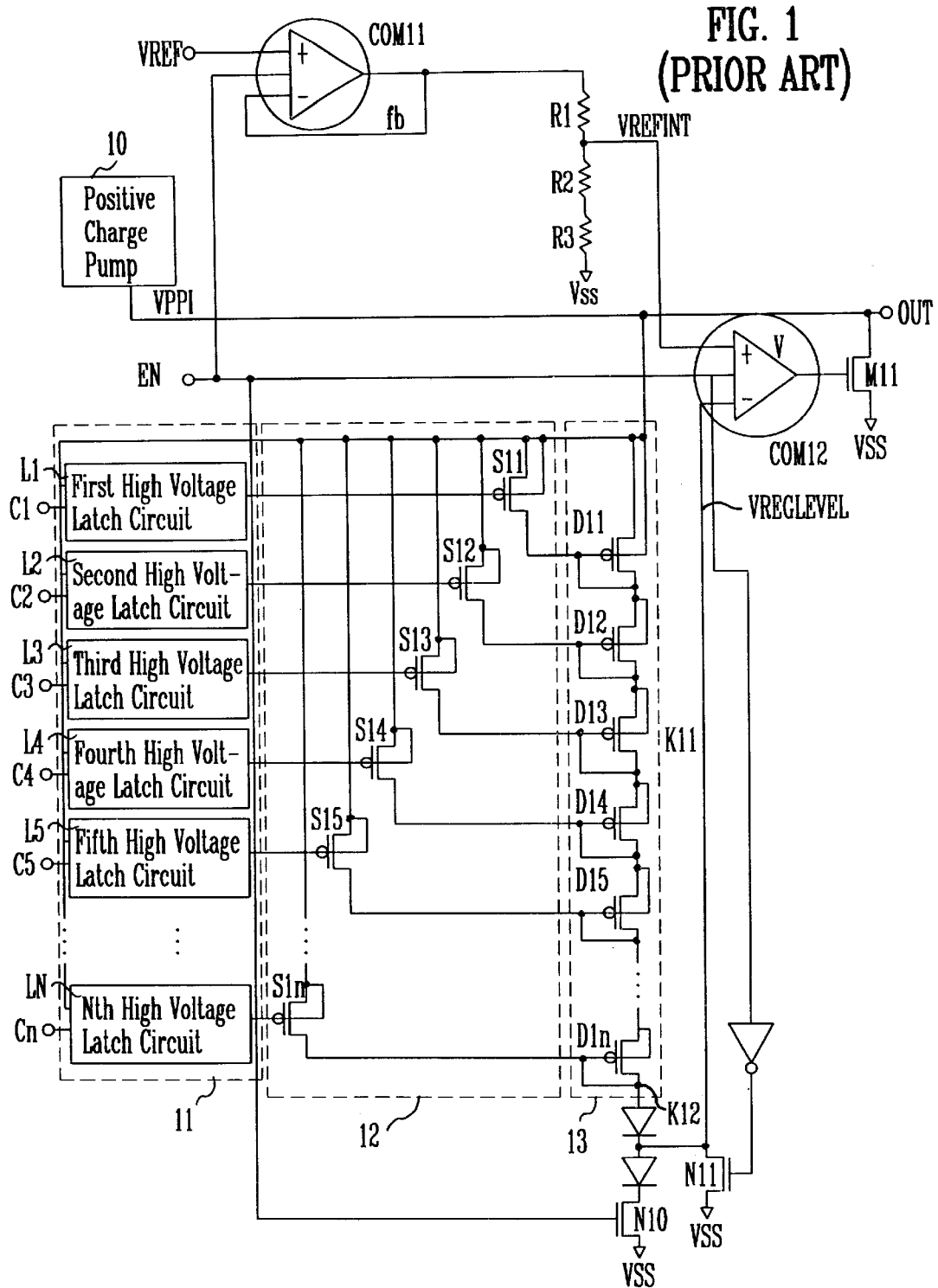
FIG. 1 is a conventional multi-step generating circuit for a flash memory.
Figure 2A:
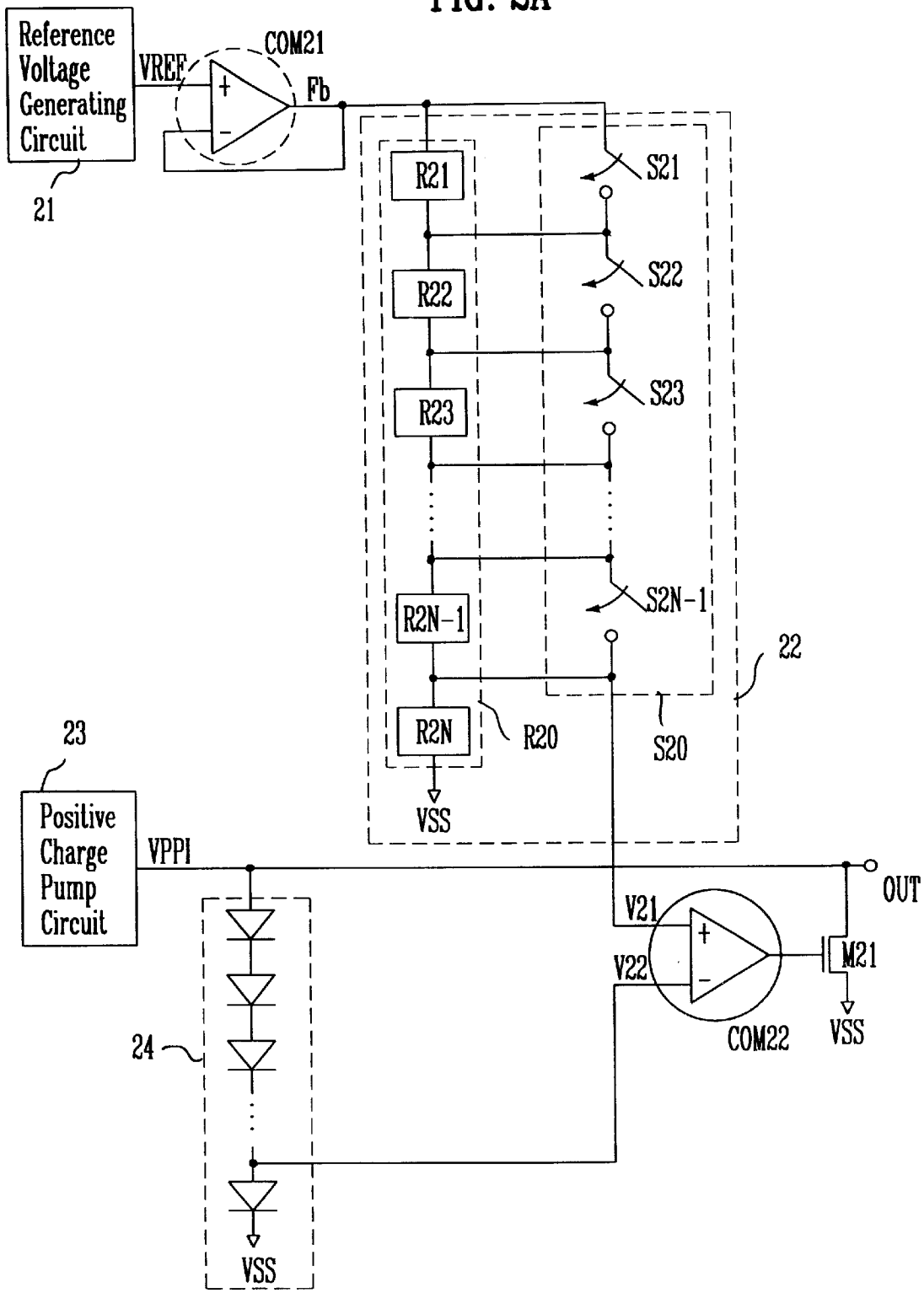
FIG. 2A is a multi-step pulse generating circuit for a flash memory in accordance with a first embodiment of the present invention.
Figure 2B:
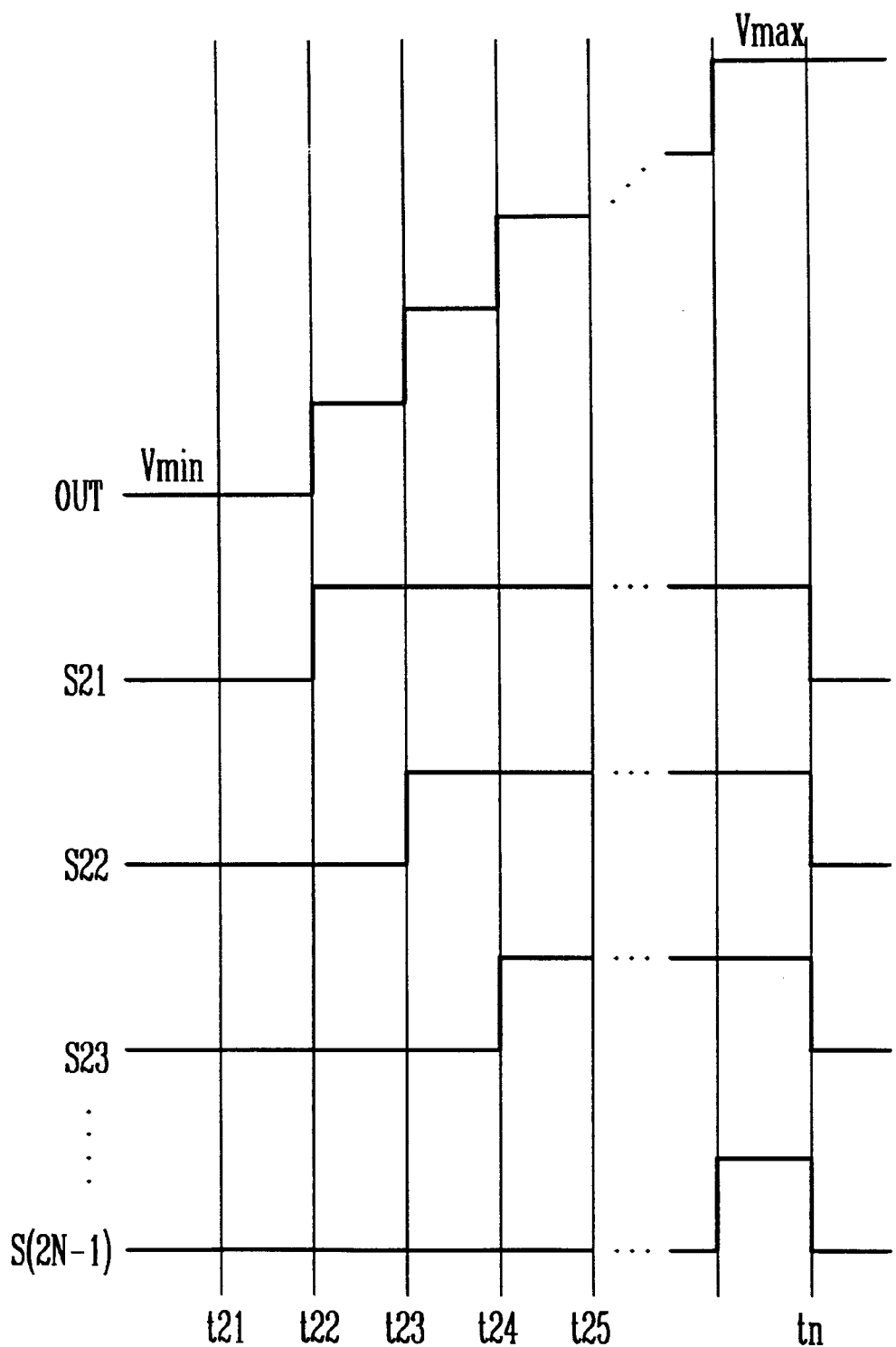
FIG. 2B is waveforms for explaining FIG. 2A.

FIGS. 2A and 2B are a circuit diagram and waveforms to describe a multi-step pulse generating circuit for a flash memory in accordance with a first embodiment of the present invention.

As shown in FIG. 2A a multi-step pulse generating circuit for a flash memory in accordance with a first embodiment of the present invention comprises: a reference voltage generating circuit 21 to generate uniform voltage; a first comparator COM21 to compare the output voltage VREF of said reference voltage generating circuit 21 with the feedback value: a voltage drop means 22 to get desirable voltage by dropping the output voltage of said first comparator COM21; a positive charge pump circuit 23 to generate desirable high voltage; a diode chain 24 to drop the output voltage VPPI of the positive charge pump circuit; a second comparator COM22 to compare the output voltage of the voltage drop means 22 with the output voltage of the diode chain 24; and a switching means M21 to control the output voltage VPPI of the positive charge pump circuit 23 depending on the output of the second comparator COM22.

A first comparator COM21 compares the reference voltage VREF generated from a reference voltage generating circuit 21 with the feedback signal Fb. To operate the first comparator COM21, two input signals VREF and Fb of the first comparator COM21 should keep fixed potential of VREF=Fb. The output signal of the first comparator COM21 is entered to the second comparator COM22 after being entered to the voltage drop means 22 and dropped as much as fixed potential. The voltage drop means 22 comprises multiple resisters (R20: R21 to R2N) serially connected between the output terminal of the first comparator COM21 and the ground terminal VSS, and multiple switches (S20: S21 to S 2N–1) connected between both ends of each resistance. The voltage (VPPI) of high potential pumped and outputted from the positive charge pump circuit 23 is entered to the second comparator COM22 after voltage drop by the diode chain 24. The second comparator COM22 compares the output of the voltage drop means with the output of the diode chain 24. Then if the output of the diode chain 24 is larger than that of the voltage drop means 22, the second comparator COM22 outputs the potential of high level and turns on the switching means M21. Accordingly, current pass is formed from the positive charge pump circuit 23 to the ground terminal VSS, and thus the pumped potential does not rise any more. On the other hand, if the output of the diode chain 24 is smaller than that of the voltage drop means 22, the second comparator COM22 outputs potential of low level and turns off the switching means M21. Therefore, current pass does not occur from the positive charge pump circuit to the ground terminal VSS and the output voltage of the positive charge pump circuit rises again.

For the output of a second comparator COM22 to determine turn-on and turn-off of a switching means M21, it was typically determined by a high voltage latch circuit to determine diode chain-on/off. However, there is a problem in that a high voltage latch circuit occupies large area in a device and coupling due to parasitic capacitor between transistors and diodes to comprise a switching circuit controlled by the high voltage latch circuit. To solve the problem in the present invention, a voltage drop means 22 is connected to the output of the first comparator COM21 and the switching means M21 is controlled, using the connection.

For example, the switches S21 to S2N of the voltage drop means 22 are controlled by the waveform shown in FIG. 2B.

If all switches S21 to S2N are off at t21 of, the output potential of the first comparator COM21 is dropped via the resistors R21 to R2N-1, and a first input voltage V21 of the second comparator COM22 becomes V21=VREF×R2N/(R21+R22+. . . +R21–1). Since the second input voltage V22 of the second comparator COM22 is larger than the first input voltage V21, the output of the second comparator COM22 gets high level, and thus turns on the switching means M21. Since current pass to the ground terminal VSS is formed by the turned-on switching means M21, the potential pumped in the positive charge pump circuit 23 does not rise. Also, the output potential OUT becomes minimum Vmin. If the switch S21 is on (at t22), V21 becomes VREF×R2N/(R22+R23+. . . +R21–1). If the switches S21 and S22 are on (at t23), V21=VREF×R2N/((R23+R24+. . . +R21–1). Since the second input voltage V22 of the second comparator COM22 is at the state to be dropped before all switches S21 and S2N-1 are off, it has lower potential than the first input voltage V21. Thus, the output of the second comparator COM22 is low level and thus the switching means M21 is turned off: According to the turned-off switching means M21, the potential being pumped in the positive charge pump circuit 23 rises. Repeating such operation, the output voltage OUT becomes highest potential Vmax if all switches S21 and S2N-1 are on (at tn). Using such a method, it is possible to get the first input voltage V21 on the second comparator COM22, and thus adjusting output voltage OUT is allowed. As the typical reference voltage VREF uses considerably lower potential(e.g., 1–1.2V) than the supply voltage Vcc, a special high potential is not needed for controlling each switch of the voltage drop means 22, and control is allowed only by supply voltage Vcc.

Figure 3A:
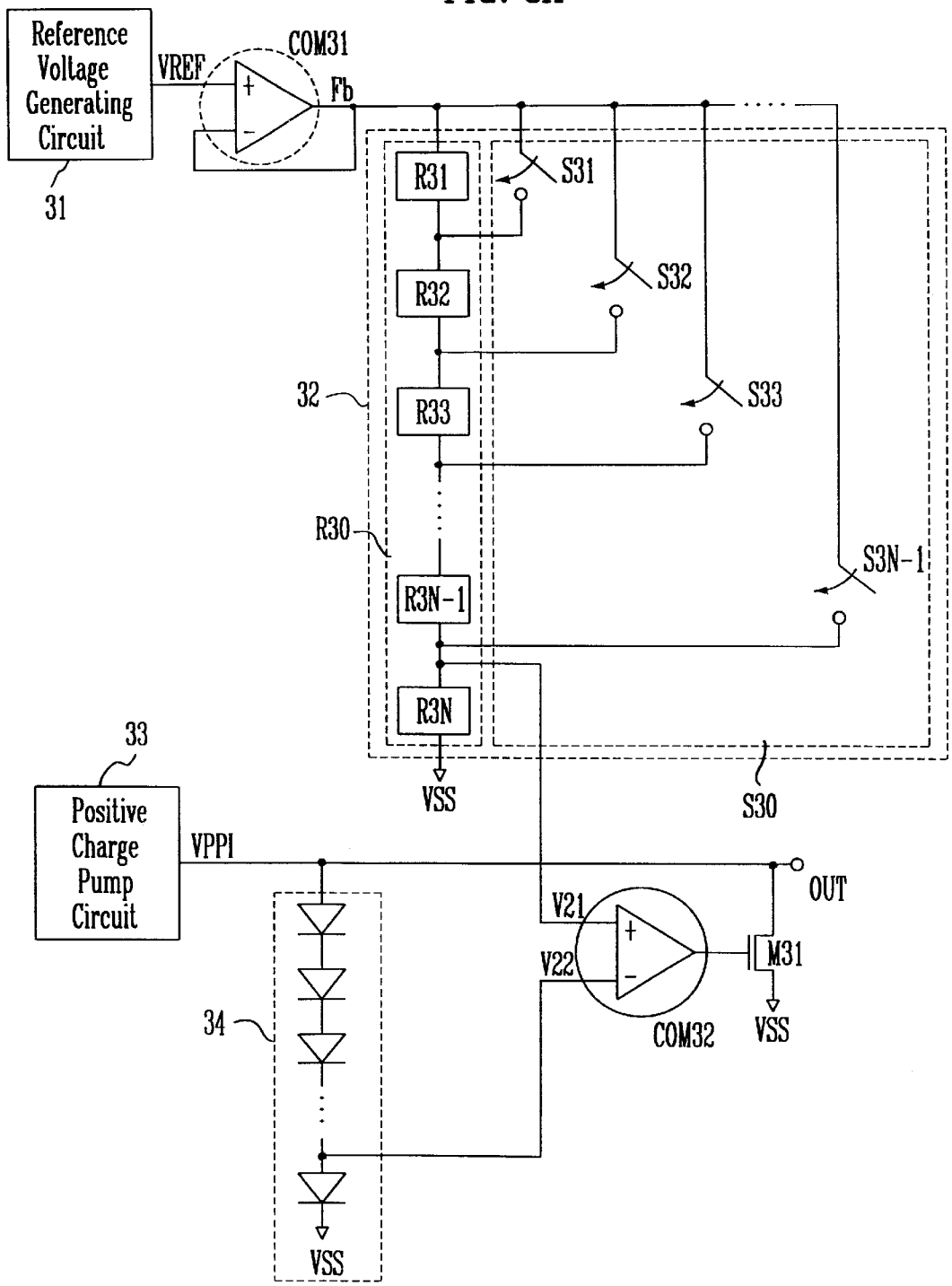
FIG. 3A is a multi-step pulse generating circuit for a flash memory in accordance with a second embodiment of the present invention.
Figure 3B:
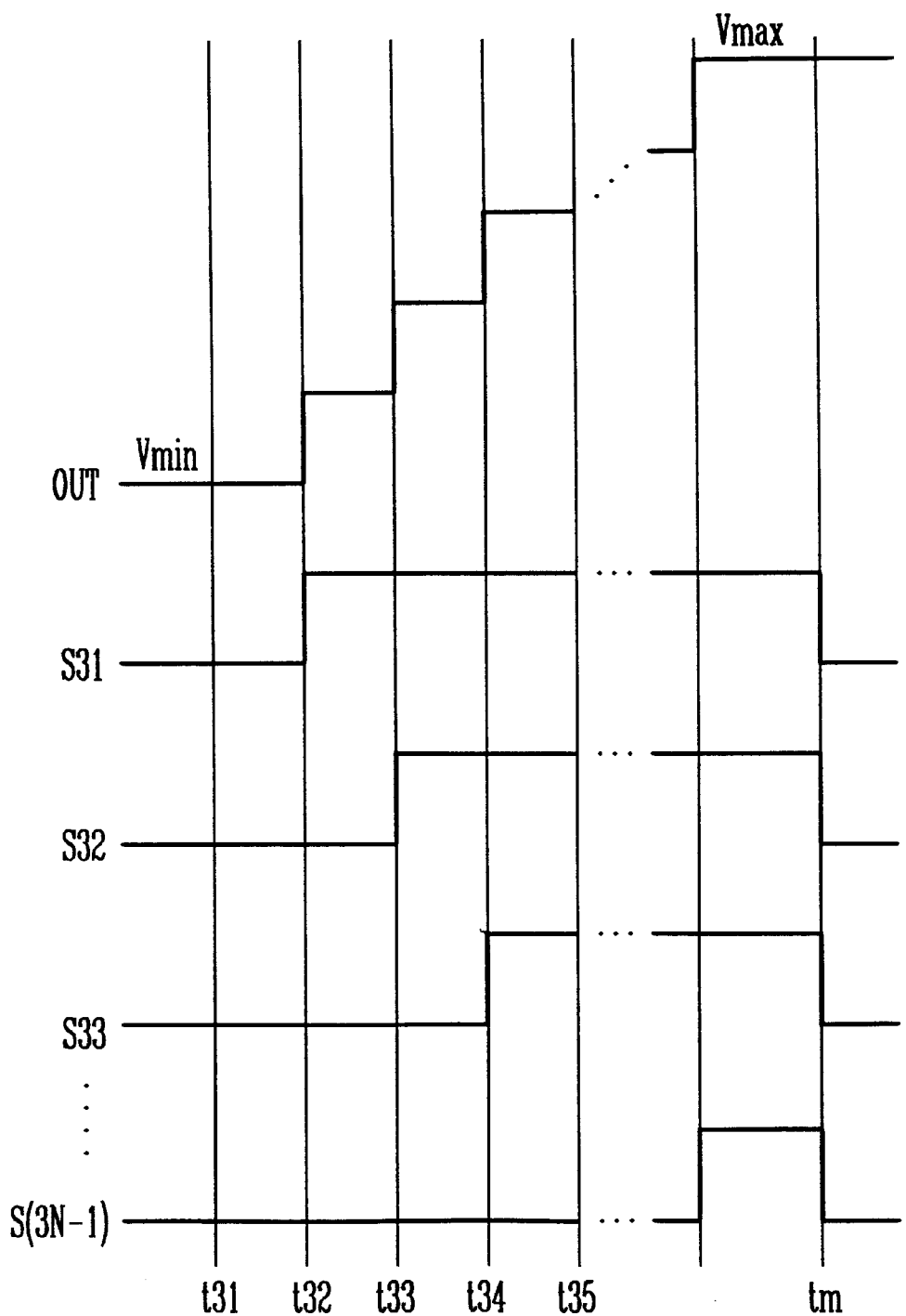
FIG. 3B is a waveforms for explaining FIG. 3A.

FIGS. 3A and 3B are a circuit diagram and wave firms to describe a multi-step pulse generating circuit for a flash memory in accordance with a second embodiment of the present invention.

As shown in FIG. 3A, a multi-step pulse generating circuit for a flash memory in accordance with a second embodiment of the present invention comprises: a reference voltage generating circuit 31 to generate uniform voltage; a first comparator COM31 to compare the output voltage VREF of the reference voltage generating circuit 31 with the feedback value Fb; a voltage drop means 32 to get desirable voltage by dropping the output voltage of the first comparator COM31; a positive charge pump circuit 33 to generate desirable high voltage; a diode chain 34 to drop the output voltage VPPI of the positive charge pump circuit 33; a second comparator COM32 to compare the output voltage of the voltage drop means 32 the output voltage of the diode chain 34; and a switching means M31 to control the output voltage VPPI of the positive charge pump circuit 33 depending on the output of the second comparator COM32.

For a multi-step pulse generating circuit in accordance with a first embodiment of the present invention, switches S21 to S2N-1 should be superposed to raise or drop high potential VPPI, in sequence, outputted from a positive charge pump circuit. If the switches S21 to S2N-1 comprise NMOS or PMOS transistors, the threshold voltage of the transistors rises by the body effect of each transistor. By the raised threshold voltage, current driving capability is lowered, and thus circuit efficiency may be lowered. To prevent such a problem, a voltage drop means 32 in accordance with a second embodiment of the present invention comprises multiple resisters (R30:R31 to R3N) serially connected between the output terminal COM31 of the first comparator COM31 and the ground terminal VSS, and multiple switches (S30:S31 to S3N-1) respectively connected in parallel between the output terminal of the first comparator COM31 and the connection points of each resistance. For example, such switches S21 to S2N of the voltage drop means 22 are controlled by the waveform as shown in FIG. 3B. Also the output voltage OUT is shown in FIG. 3B. Such a multi-step pulse generating circuit is similar to the circuit in FIG. 2A, but configuration of the voltage drop means 32 show difference.

The present invention described above may implement a multi-step pulse generating circuit with even smaller circuit area and improve driving capability of a device by preventing coupling due to size difference of diodes to comprise a switching means and a diode chain.

While the present invention has been described and illustrated herein with reference to the certain preferred embodiment thereof, those skilled in the art will recognize the many modifications and enhancements in form and details which can be made therein without departing from the true spirit and scope of the invention.

What is claimed is:

1. A multi-step pulse generating circuit for a flash memory comprising:
   a reference voltage generating circuit to generate uniform voltage;
   a first comparator to compare an output voltage of said reference voltage generating circuit with a feedback value of said first comparator;
   a voltage drop circuit configured to selectively output one of a plurality of voltages in response to an output voltage from the first comparator;
   a positive charge pump circuit to generate desirable high voltage;
   a diode chain to drop the output voltage of said positive charge pump circuit;
   a second comparator to compare the output voltage of said voltage drop circuit with the output voltage of said diode chain; and
   a switching means to control the output voltage of said positive charge pump circuit depending on the output of said second comparator.

2. A multi-step pulse generating circuit for a flash memory comprising:
   a reference voltage generating circuit to generate uniform voltage;
   a first comparator to compare an output voltage of said reference voltage generating circuit with the feedback value of said first comparator;
   a voltage drop means to obtain desirable voltage by dropping an output voltage of said first comparator, the voltage drop means comprising:
      multiple resistors serially connected between the output terminal of said first comparator and a ground terminal; and
      multiple switches respectively connected between both ends of said resistors;
   a positive charge pump circuit to generate desirable high voltage;
   a diode chain to drop the output voltage of said positive charge pump circuit;
   a second comparator to compare the output voltage of said voltage drop means with the output voltage of said diode chain; and
   a switching means to control the output voltage of said positive charge pump circuit depending on the output of said second comparator.

3. A multi-step pulse generating circuit for a flash memory comprising:
   a reference voltage generating circuit to generate uniform voltage;
   a first comparator to compare an output voltage of said reference voltage generating circuit with the feedback value of said first comparator;
   a voltage drop means to obtain desirable voltage by dropping an output voltage of said first comparator, the voltage drop means comprising:
      multiple resistors serially connected between the output terminal of said first comparator and the ground terminal; and
      multiple switches connected in parallel between the output terminal of said first comparator and each connection point of each resistor;
   a positive charge pump circuit to generate desirable high voltage;
   a diode chain to drop the output voltage of said positive charge pump circuit;
   a second comparator to compare the output voltage of said voltage drop means with the output voltage of said diode chain; and
   a switching means to control the output voltage of said positive charge pump circuit depending on the output of said second comparator.

4. A multi-step pulse generating circuit for a flash memory comprising:
   a reference voltage generating circuit to generate uniform voltage;
   a first comparator to compare an output voltage of said reference voltage generating circuit with the feedback value of said first comparator;
   a voltage drop means to obtain desirable voltage by dropping an output voltage of said first comparator, wherein said voltage drop means comprises multiple resistors serially connected between the output terminal of said first comparator and a ground terminal and multiple switches respectively connected between both ends of said resistors;
   a positive charge pump circuit to generate desirable high voltage;
   a diode chain to drop the output voltage of said positive charge pump circuit;
   a second comparator to compare the output voltage of said voltage drop means with the output voltage of said diode chain; and a switching means to control the output voltage of said positive charge pump circuit depending on the output of said second comparator.

5. A multi-step pulse generating circuit for a flash memory comprising:

a reference voltage generating circuit to generate uniform voltage;

a first comparator to compare an output voltage of said reference voltage generating circuit with the feedback value of said first comparator;

a voltage drop means to obtain desirable voltage by dropping an output voltage of said first comparator, wherein said voltage drop means comprises multiple resistors serially connected between the output terminal of said first comparator and the ground terminal and multiple switches connected in parallel between the output terminal of said first comparator and each connection point of each resistor;

a positive charge pump circuit to generate desirable high voltage;

a diode chain to drop the output voltage of said positive charge pump circuit; a second comparator to compare the output voltage of said voltage drop means with the output voltage of said diode chain; and a switching means to control the output voltage of said positive charge pump circuit depending on the output of said second comparator.

* * * * *